United States Patent [19]

Maass et al.

[11] Patent Number: 5,182,003
[45] Date of Patent: Jan. 26, 1993

[54] STATIONARY MAGNETRON SPUTTERING CATHODE FOR A VACUUM COATING APPARATUS

[75] Inventors: Wolfram Maass, Erlensee; Ulrich Patz, Linsengericht, both of Fed. Rep. of Germany

[73] Assignee: Leybold Aktiengesellschaft, Hanau, Fed. Rep. of Germany

[21] Appl. No.: 662,060

[22] Filed: Feb. 28, 1991

[30] Foreign Application Priority Data

Dec. 7, 1990 [DE] Fed. Rep. of Germany ....... 4039101

[51] Int. Cl.[5] ............................................. C23C 14/35
[52] U.S. Cl. ........................ 204/298.23; 204/298.19; 204/298.28
[58] Field of Search ............. 204/298.19, 298.23, 204/298.28

[56] References Cited

U.S. PATENT DOCUMENTS

| 4,312,731 | 1/1982 | Morrison | 204/192.12 |
| 4,437,966 | 3/1984 | Hope et al. | 204/298.29 |
| 4,746,417 | 5/1988 | Ferenbach et al. | 204/298.2 |

FOREIGN PATENT DOCUMENTS

| 0365249 | 4/1990 | European Pat. Off. | 204/298.2 |
| 2707144 | 8/1977 | Fed. Rep. of Germany | 204/298.2 |
| 60-116774 | 6/1985 | Japan | 204/298.19 |
| 60-224775 | 11/1985 | Japan | 204/298.19 |
| 62-149867 | 7/1987 | Japan | 204/298.19 |
| 63-317671 | 12/1988 | Japan | 204/298.19 |

OTHER PUBLICATIONS

VEB Hochvakuum, "Vakuum Information", Oct. 31, 1983, p. 444.

Primary Examiner—Aaron Weisstuch
Attorney, Agent, or Firm—Felfe & Lynch

[57] ABSTRACT

A stationary magnetron sputtering cathode for vacuum coating systems for substrates 17 passing in front of the cathode 10 on a circular path K and disposed on a substrate holder 4 has a circular disk-like yoke plate 15, and a first group or row of magnets 14b, 14b'..., essentially forming a closed circular ring, is provided in the marginal zone of the yoke plate 15 and a second group or row of magnets 14a, 14a'..., forming a random but essentially symmetric configuration, is provided in the center of the yoke plate 15. The segment of the magnetic tunnel located in the half (III+IV) of the yoke plate 15 which faces away from the rotating shaft 5 of the substrate holder 4 has a greater total length than the tunnel segment provided on the half (I+II) of yoke plate 15 facing toward the rotating shaft 5.

5 Claims, 3 Drawing Sheets

STATIONARY MAGNETRON SPUTTERING CATHODE FOR A VACUUM COATING APPARATUS

BACKGROUND OF THE INVENTION

The invention relates to a stationary magnetron sputtering cathode for a vacuum deposition apparatus for substrates which pass in front of the cathode on a circular path and are disposed on a rotatable substrate holder. It comprises a target plate and a support plate which is disposed on a plane parallel to this target plate. It further includes a magnet system which is disposed behind the target plate and composed of plurality of permanent magnets. A first group or row thereof has the same polarity orientation and second group or row of magnets has an opposite polarity orientation so that a closed tunnel of magnetic flux lines starting at the first group or row and returning to the second group or row is formed above the target plate.

Magnetron sputtering cathodes are distinguished from those sputtering systems without the support of a magnetic field by a sputtering rate which is increased by the factor 10 to 30. This advantage, however, entails the disadvantage of an extremely irregular sputtering of the target plates since the constriction forced upon the plasma by the magnetic tunnel of magnetrons is reflected in a corresponding spatial restriction of the sputtering effect. The formation of an erosion trench where the lowest point lies below the culmination points of the magnetic flux lines requires that the sputtering be terminated after the sputtering of only 25 to 30% of the target material In stationary coating systems, i.e. those without a relative movement between cathode and substrates, this causes a very irregular distribution of the layer thicknesses. In principle, this means the erosion trench will be photographically, so to speak, reproduced on the substrates.

These problems along with a series of attempts to solve them are discussed in DE-OS 27 07 144 and DE-OS 36 19 194, to which U.S. Pat. No. 4,746,417 corresponds. The solution attempts include in particular a magnetron sputtering cathode where one single, self-contained magnet system in an eccentric position rotates behind a circular target plate (FIGS. 22 to 25 of DE-OS 27 07 144). The magnets form two nested, self-contained rows of magnets.

Further, from EP 0 365 249 A2 it is known (FIG. 6) in connection with a rotating sputtering cathode with a circular-disk like target plate to provide a number of the magnets in a row behind this plate so that the magnets form a non-symmetric loop and to provide the remaining magnets in an insular and contiguous manner in the center of the target plate. All the magnets of the row which form the loop are with their south poles aligned with the target plate, and those magnets joined in the insular arrangement are with their north poles directed to the target plate.

Further, it is known ("Vakuum-Information" issued by VEB Hochvakuum Dresden, Oct. 31, 1983, page 444, picture 1) to configure the target plate of a sputtering cathode as an approximately equilateral triangle and to dispose the magnets on the rear thereof in one row. Approximately parallel to two edges of this triangular plate and in the area of the third edge, this row of magnets follows an inwardly bound, bent path. Due to its special configuration, this cathode, referred to as a triangular plasmatron, permits quite a good distribution of the layer thickness on a substrate which passes in front of the target on a circular path.

Finally, from U.S. Pat. No. 4,631,106 (FIG. 7), it is known to place a plurality of magnets behind a rotating, circular-disk-like yoke plate in two spiral rows in such a manner that one row of magnets of the same polarity is located opposite a parallel row of magnets of the opposite polarity.

SUMMARY OF THE INVENTION

It is an object of the invention to improve a magnetron cathode of the aforesaid kind in such a way that the distribution of the layer thickness is more uniform, thus simultaneously improving the exploitation of the target material.

The invention accomplishes this object with a magnetron sputtering cathode of the aforesaid kind in that the target plate has a circular-disk-like configuration. Further, the first group or row of magnets, essentially forming a closed circular ring, is provided in the marginal zone of the target plate and the second group or rows of magnets, forming a random but symmetric configuration, is provided in the central part of the target plate. The total length of the segment of the magnetic tunnel which runs in the half of the target plate facing away from the rotating shaft of the substrate holder is larger than the tunnel segment provided in the half of the target plate facing toward the rotating shaft.

DETAILED DESCRIPTION OF THE INVENTION

Figure 1:
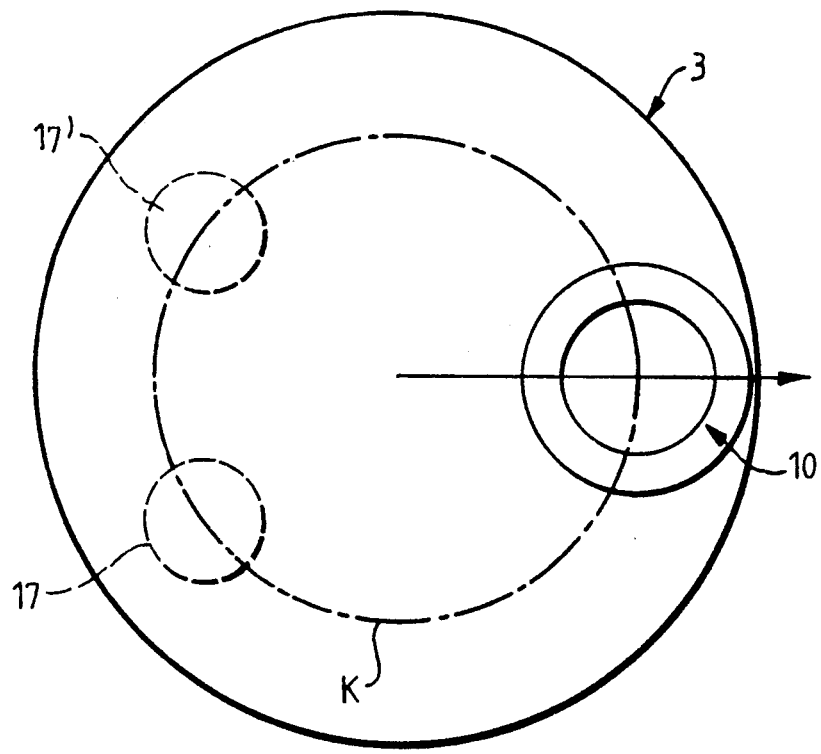
FIG. 1 is a diagram of a vacuum coating system in top view.
Figure 2:
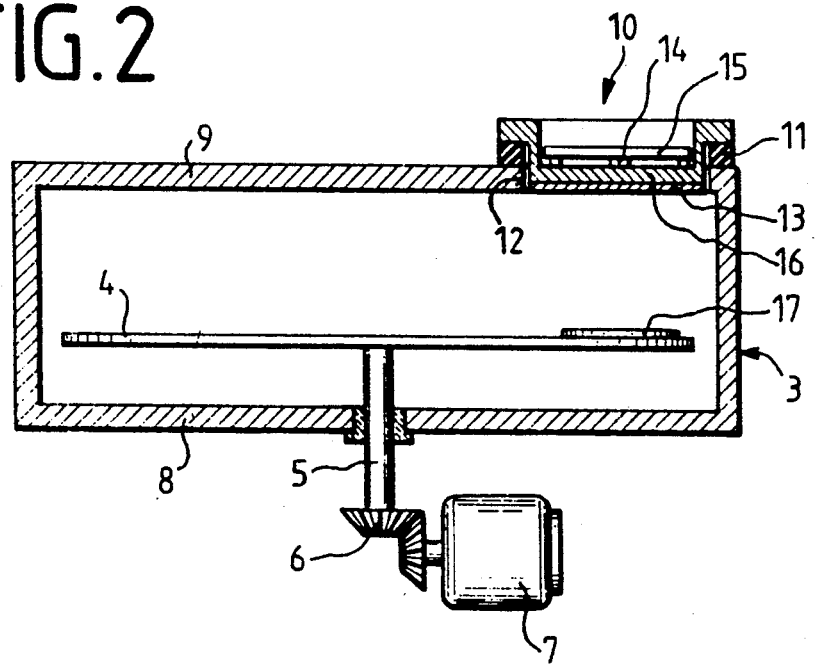
FIG. 2 is a lateral and a sectional view of a highly simplified representation of a vacuum coating system.

Referring to FIGS. 1–2, the vacuum coating system essentially comprises the circular-cylindrical process chamber 3, the substrate plate 4, the rotating shaft 5 thereof which passes through the chamber bottom part 8 and is driven, via a gear arrangement 6, by an electromotor 7. Further, it includes a cathode 10 disposed in an opening of cover 9. This cathode, by means of an insulating ring 11, rests and is held on the edge of opening 12. It has a target 13 made of the material to be sputtered, with a plurality of permanent magnets 14 being disposed behind the target. These magnets are connected to one another via a circular disk-like yoke plate 15, with the target 13, the magnets 14, and the yoke plate 15 being connected to a cathode base or a support plate 16 which in turn rests with its circular-ring-like collar on the insulating ring 11.

During the coating process, there is a vacuum in the process chamber. The housing itself forms the anode and parts 13 to 16 form the cathode from which the target material flows to the L substrates 17, 17′, . . . located on the substrate holder 4 and (as seen in FIG. 1) which slowly passes in front of cathode 10 following a circular path K.

Since cathode 10 has a circular-disk-like cross section or projection surface, the substrate 17 passing underneath it on a circular path would have an irregular coating even if the remaining structure of cathode 10, especially the arrangement of magnets 14, were completely uniform and symmetric, i.e. when the plasma tube forming underneath target 13 would assume the form of a circular ring. This uneven coating is in particular due to the varying residence times of individual parts of substrate 17 in the action range of cathode 10 while it passes on its circular path.

Figure 3:
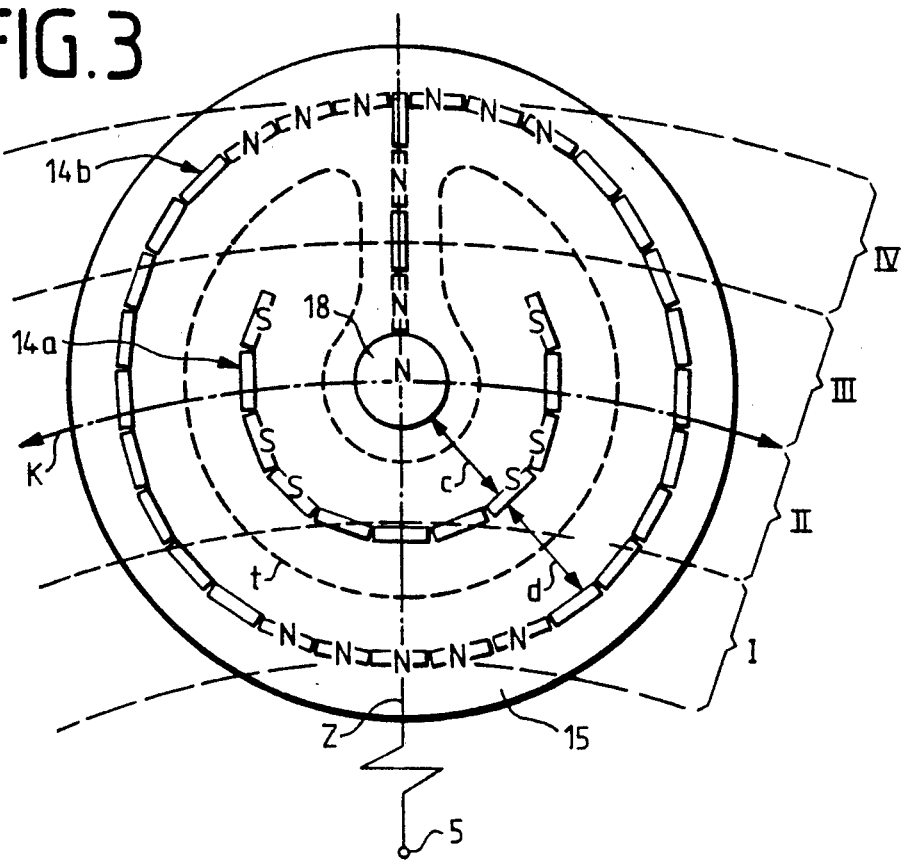
FIGS. 3–6 are enlarged top views of different support plates, each with different magnet arrangements.

In the present invention, the magnets 14a, 14b, ... are arranged (cf. FIGS. 3 to 6) on yoke plates 15 in such manner that the closed tunnel t (the upper half in FIG. 3) will be longer on a portion IV of yoke plate 15 than on another portion I (of the equally large portion I at the bottom of FIG. 3). The plasma tube defined by the magnetic tunnel t is hence more effective on the upper half (the radially external half III+IV) of cathode 10 than it is on the lower half (which is particularly well illustrated in the magnetron arrangement 14a', 14b' of FIG. 4). The half a of substrate 17, which is radially on the outside and passes underneath cathode 10 at a higher speed, can thus be sputtered with the same layer thickness as the lower half b of substrate 17.

Figure 5:
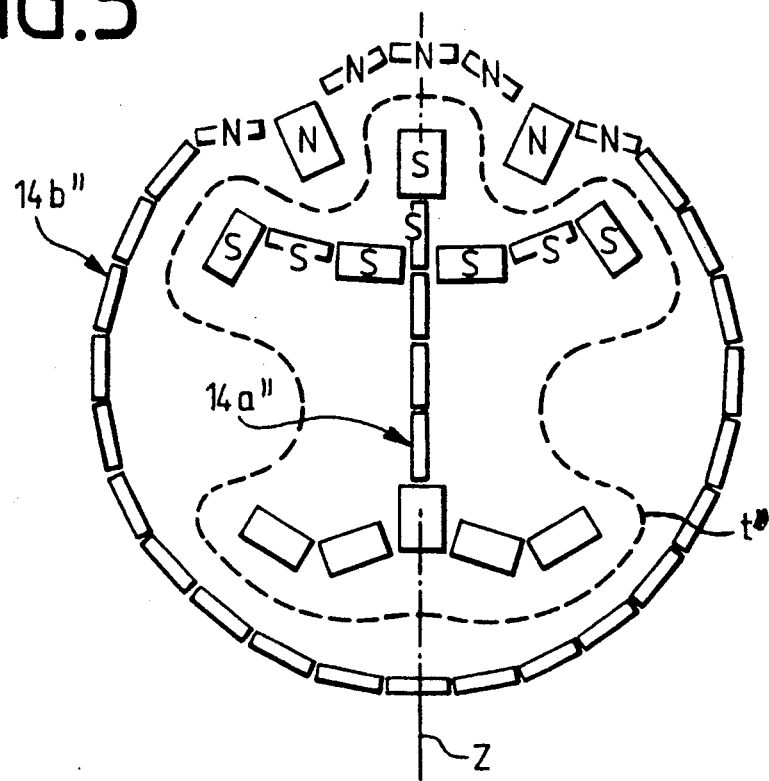
Figure 6:
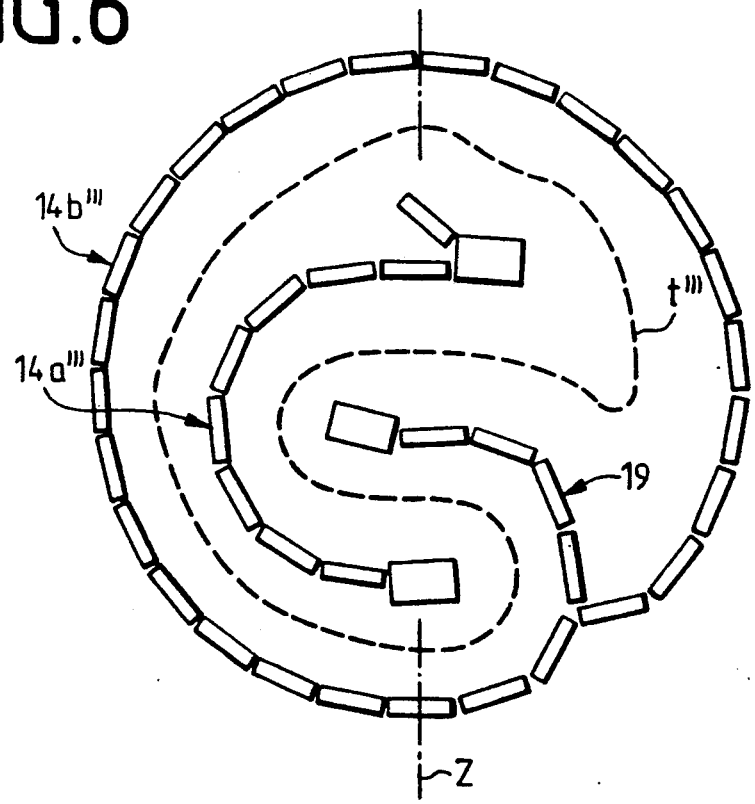

The various portions and zones were not included in the representation of the embodiments according to FIGS. 5 and 6. However, it should be obvious that these magnet arrangements 15a'', 14b'' and 14a''' and 14b''' satisfy the requirement to configure that plasma tubes on the outer half of the target and/or the yoke plate 15 to be longer than on the other half. The corresponding paths of the magnetic tunnels t'' and t''' are indicated in broken lines.

Figure 4:
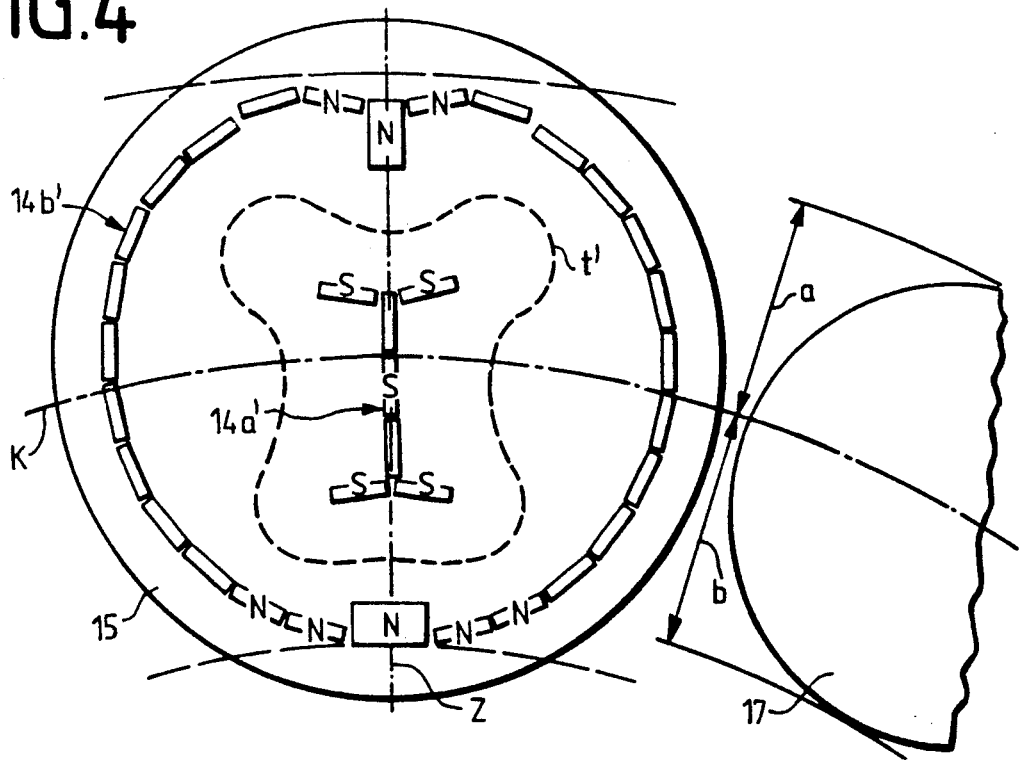

As seen clearly in FIG. 3, each of the first group or row of magnets, e.g. magnets 14a arranged in a semi-circle, have a different polarity with respect to the second row of magnets 14b forming a closed loop to which another straight row of magnets is connected. In the first (inside) row 14a, south poles S face toward the substrate 17 whereas in the second row, the north poles N face toward the substrate 17. It is understood that the individual magnets in the embodiments of FIGS. 4 to 6 are arranged in the same manner, i.e. of opposite polarities.

As seen particularly in FIG. 5, the individual magnets of a row or group 14a'' and 14b'4 of magnets can have different dimensions and power which of course affects the course of the plasma tube and its performance.

Whereas the arrangement of the permanent magnets on the yoke plate is rotationally balanced in the magnetron having a round cathode according to the prior art, the permanent magnets of the round cathode of the present invention are arranged on the yoke plate either mirror symmetrically with respect to a radius Z of the substrate holder or do not require a defined symmetry at all.

The goal in any case is the generation of a plasma enclosure (race track) which permits the desired deposition distribution in the substrate area. The use of different target materials, sputtering methods (DC-sputtering, RF-sputtering) and special systems and their configurations require different magnet arrangements.

Moreover, in a single arrangement, it is necessary to leave the position and size of some "calibrating magnets" to some extent undetermined in order to allow a fine calibration of the homogeneity of the layer thickness (cf. magnets 18 in the embodiment of FIG. 3).

To date, homogeneous layer thicknesses in magnetrons having round cathodes have been obtained by providing so called aperture diaphragms where the material beam emerging from the cathode is directed such that the desired homogeneity of the layer thickness is obtained. A disadvantage is the reduction of the effective sputtering ring which is caused by the diaphragms and the layer growing on the diaphragms. These problems are overcome with the above described round cathode of the present invention.

As compared to segmental or trapezoidal cathodes, the round cathode of the invention is also substantially simpler and hence less expensive to manufacture. These cathodes can generally be readily installed in existing systems which in itself is a considerable advantage.

We claim:

1. Stationary magnetron sputtering cathode vacuum deposition apparatus, comprising
   a substrate holder rotatable about a central axis of rotation in order to move a substrate fixed thereon on a path represented by a circular line traced by the center of said substrate as said holder rotates,
   a target plate situated parallel to said circular path,
   a yoke plate situated parallel to said target plate opposite said circular path,
   a first group of substantially contiguous permanent magnets situated on said yoke plate comprising a closed loop and having a like polarity facing said target, and
   a second group of substantially contiguous permanent magnets situated on said yoke plate inside of said closed loop and having a like polarity facing said target which is opposite the polarity of said first group, thereby forming a closed tunnel of magnetic flux lines above said target plate and extending between said first group and said second group,
   said permanent magnets in said first and second groups being arranged so that the portion of the magnetic tunnel outside of said circular path is longer than the portion of the magnetic tunnel inside of the circular path.

2. Stationary magnetron sputtering cathode vacuum deposition apparatus as in claim 1 wherein said magnets of the first group have different dimensions from each other and the magnets of the second group have different dimensions from each other.

3. Stationary magnetron sputtering cathode vacuum deposition apparatus as in claim 1 wherein said first group of permanent magnets comprises a cylindrical magnet in the center of said yoke plate and a first row of magnets extending radially from said cylindrical magnet to said closed loop, said closed loop being substantially circular, said second group comprising a semicircular open loop situated equidistant from said cylindrical magnet and said closed loop.

4. Stationary magnetron sputtering cathode vacuum deposition apparatus as in claim 1 wherein said second group of magnets is symmetrically arranged relative to a radius extending from said axis of rotation.

5. Stationary magnetron sputtering cathode vacuum deposition apparatus as in claim 4 wherein said second group of magnets has an I-shaped configuration.

* * * * *

UNITED STATES PATENT AND TRADEMARK OFFICE
CERTIFICATE OF CORRECTION

PATENT NO. : 5,182,003
DATED : January 26, 1993
INVENTOR(S) : Maass et al.

It is certified that error appears in the above-indentified patent and that said Letters Patent is hereby corrected as shown below:

Col. 1, line 33    Change "material In" to --material. In--;

Col. 2, line 60    Delete "L" before "substrates";

Col. 3, line 24    Change "15a, 14b" to --14a",14b"--; and

Col. 3, line 42    Change "14a" and 14b'4" to --14a" and 14b"--.

Signed and Sealed this

Thirty-first Day of January, 1995

Attest:

BRUCE LEHMAN

Attesting Officer    Commissioner of Patents and Trademarks